(12) United States Patent
Park et al.

(10) Patent No.: US 7,230,375 B2
(45) Date of Patent: Jun. 12, 2007

(54) ACTIVE MATRIX ORGANIC ELECTROLUMINESCENT DEVICE AND FABRICATING METHOD THEREOF

(75) Inventors: Jae-Yong Park, Anyang-Si (KR); Juhn-Suk Yoo, Seoul (KR); Nam-Yang Lee, Seongnam-si (KR); In-Jae Chung, Gacheon-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 432 days.

(21) Appl. No.: 10/330,283

(22) Filed: Dec. 30, 2002

(65) Prior Publication Data
US 2003/0205973 A1 Nov. 6, 2003

(30) Foreign Application Priority Data
May 3, 2002 (KR) .................. 10-2002-0024553

(51) Int. Cl.
*H01L 21/336* (2006.01)
(52) U.S. Cl. .................. 313/506; 313/504; 345/76; 257/40
(58) Field of Classification Search .............. 313/504, 313/506; 257/57, 59, 61, 82, 72, 40; 315/169.1; 345/76
See application file for complete search history.

(56) References Cited

U.S. PATENT DOCUMENTS

| 5,276,380 | A | 1/1994 | Tang |
| 5,294,869 | A | 3/1994 | Tang et al. |
| 5,294,870 | A | 3/1994 | Tang et al. |
| 5,302,987 | A * | 4/1994 | Kanemori et al. ......... 349/143 |
| 5,701,055 | A | 12/1997 | Nagayama et al. |
| 5,742,129 | A | 4/1998 | Nagayama et al. |
| 5,952,037 | A | 9/1999 | Nagayama et al. |
| 6,046,547 | A | 4/2000 | Nishio et al. |
| 6,175,345 | B1 | 1/2001 | Kuribayashi et al. |
| 6,373,455 | B1 | 4/2002 | Kuribayashi et al. |
| 6,548,961 | B2 | 4/2003 | Barth et al. |
| 6,806,495 | B1 * | 10/2004 | Yamazaki et al. ............ 257/59 |
| 6,867,761 | B2 * | 3/2005 | Matsueda .................... 345/100 |
| 6,927,813 | B2 * | 8/2005 | Takizawa .................... 349/106 |
| 6,994,414 | B2 * | 2/2006 | Hashimoto et al. .......... 347/19 |
| 2002/0158577 | A1 | 10/2002 | Shimoda et al. |
| 2003/0138998 | A1 * | 7/2003 | Yamazaki et al. .......... 438/155 |
| 2004/0246410 | A1 * | 12/2004 | Kim ........................... 349/110 |

FOREIGN PATENT DOCUMENTS

| JP | 04-338728 | 11/1992 |
| JP | 2000-221903 | 8/2000 |
| JP | 2001-177509 | 4/2001 |
| JP | 2002-141170 | 5/2002 |
| JP | 2002-176063 | 6/2002 |
| KR | 2002-0047889 | 6/2002 |
| KR | 2003-44567 | 9/2003 |
| WO | WO-02/078101 | 10/2002 |

* cited by examiner

*Primary Examiner*—Karabi Guharay
(74) *Attorney, Agent, or Firm*—Morgan, Lewis & Bockius LLP

(57) ABSTRACT

An organic electroluminescent device including a substrate, a gate line on the substrate, a data line on the substrate, wherein the data line crosses the gate line, a switching element connected to the gate line and the data line, a plurality of driving elements connected to the switching element, each of the plurality of driving elements are interconnected in parallel, and an organic electroluminescent diode connected to each of the plurality of driving elements.

5 Claims, 6 Drawing Sheets

ACTIVE MATRIX ORGANIC ELECTROLUMINESCENT DEVICE AND FABRICATING METHOD THEREOF

The present invention claims the benefit of the Korean Patent Application No. 2002-24553 filed in Korea on May 3, 2002, which is hereby incorporated by reference.

BACKGROUND OF THE INVENTION

1. Field of the Invention

The present invention relates to an organic electroluminescent device, and more particularly, to an active matrix organic electroluminescent device including amorphous silicon thin film transistor and a fabricating method thereof.

2. Discussion of the Related Art

In general, an organic electroluminescent device (ELD) emits light by injecting electrons from a cathode and holes from an anode into an emission layer, combining the electrons with the holes, generating an exciton, and transitioning the exciton from an excited state to a ground state. Contrary to a liquid crystal display (LCD) device, an additional light source is not necessary for the organic ELD to emit light because the transition of the exciton between states causes light to be emitted. Accordingly, the size and weight of the organic ELD can be reduced. The organic ELD has other excellent characteristics such as low power consumption, superior brightness, and fast response time. Because of these characteristics, the organic ELD is regarded as a promising candidate for next-generation consumer electronic applications such as cellular phones, car navigation system (CNS), personal digital assistants (PDA), camcorders, and palmtop computers. Moreover, since fabricating the organic ELD is a simple process with few processing steps, it is much cheaper to produce an organic ELD than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively high amount of power to operate. In addition, the display size of a passive matrix organic ELD is limited by its structure. Furthermore, as the number of conductive lines increases, the aperture ratio of a passive matrix organic ELD decreases. In contrast, active matrix organic ELDs are highly efficient and can produce a high-quality image for a large display with relatively low power.

FIG. 1 is a schematic cross-sectional view of an organic ELD according to the related art. In FIG. 1, an array element 14 including a thin film transistor (TFT) "T" is formed on a first substrate 12. A first electrode 16, an organic electroluminescent layer 18, and a second electrode 20 are formed over the array element 14. The organic electroluminescent layer 18 may separately display red, green, and blue colors for each pixel region. Generally, separate organic materials are used to emit light of each color for the organic electroluminescent layer in each pixel region. An organic ELD is encapsulated by attaching the first substrate 12 and a second substrate 28, which includes a moisture absorbent material 22, with a sealant 26. The moisture absorbent material 22 eliminates moisture and oxygen that may penetrate into a capsule of the organic electroluminescent layer 18. After etching a portion of the second substrate 28, the etched portion is filled with the moisture absorbent material 22 and the filled moisture absorbent material is fixed by a holding element 25.

FIG. 2 is an equivalent circuit diagram of an organic electroluminescent device according to the related art. In FIG. 2, a gate line 14 crosses a data line 16, and a switching element "$T_S$" is connected to the gate line 14 and the data line 16 at the crossing point of the gate line 14 and the data line 16. A driving element "$T_D$" is electrically connected to the switching element "$T_S$" and an organic electroluminescent diode "$D_{EL}$." A storage capacitor "$C_{ST}$" is formed between a driving gate electrode 20 and a driving drain electrode of the driving element "$T_D$," and the organic electroluminescent diode "$D_{EL}$" is connected to a power line 22.

When a scan signal of the gate line 14 is applied to a switching gate electrode 18 of the switching element "$T_S$," an image signal of the data line 16 is applied to the driving gate electrode 20 of the driving element "$T_D$" through the switching element "$T_S$." The current density of the driving element "$T_D$" is modulated by the image signal applied to the driving gate electrode 20. As a result, the organic electroluminescent diode "$D_{EL}$" can display images with gray scale. Moreover, since the image signal stored in the storage capacitor "$C_{ST}$" is applied to the driving gate electrode 20, the current density flowing into the organic electroluminescent diode "$D_{EL}$" is kept uniform until the next image signal is applied even when the switching element "$T_S$" is turned OFF. The switching element "$T_S$" and the driving element "$T_D$" can be formed of a polycrystalline silicon TFT or an amorphous silicon TFT. The process of fabricating an amorphous silicon TFT is simpler than the process for a polycrystalline silicon TFT. The amorphous silicon TFT should have a larger width to length ratio (W/L ratio) to drive the organic electroluminescent diode "$D_{EL}$." As the W/L ratio of the amorphous silicon TFT becomes larger, the current density flowing through the amorphous silicon TFT increases. High current density may cause the amorphous silicon TFT to degrade due to stress, thereby disadvantageously changing conductive characteristics of the amorphous silicon TFT. Moreover, the changes in the conductive characteristics of the amorphous silicon TFT are exacerbated when a direct current (DC) bias is continuously applied to the driving element "$T_D$" in the organic electroluminescent device. As a result, the display quality of an amorphous silicon TFT is inferior and may result in residual images being displayed. In addition, the driving element "$T_D$" may sometimes break down due to the stress caused by the increased current density. When the driving element "$T_D$" is composed of one TFT, a broken TFT would cause a point defect.

SUMMARY OF THE INVENTION

Accordingly, the present invention is directed to an organic electroluminescent device and a fabricating method thereof that substantially obviate one or more of the problems due to limitations and disadvantages of the related art.

An object of the present invention is to provide an organic electroluminescent device where a plurality of driving elements are connected to each other in parallel, and a fabricating method thereof.

Another object of the present invention is to provide an active matrix organic electroluminescent device with high display quality and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device including a substrate; a gate line on the substrate, a data line on the substrate, wherein the data line crosses the gate line, a switching element connected to the gate line and the data line, a plurality of driving elements connected to the switching element, each of the plurality of driving elements are interconnected in parallel, and an organic electroluminescent diode connected to each of the plurality of driving elements.

In another aspect, a method of fabricating an organic electroluminescent device, including steps of forming a gate line on a substrate, forming a switching element connected to the gate line, forming a plurality of driving elements connected to the switching element, each of the plurality of driving elements are interconnected in parallel, forming a data line, the data line crosses the gate line and is connected to the switching element, and forming an organic electroluminescent diode connected to each of the plurality of driving elements.

In another aspect, a driving system for an organic electroluminescent device including a gate electrode, a plurality of active layers over the gate electrode, a source electrode on each of the plurality of active layers, the source electrode including an uneven shape having protruding portions and receded portions such that the protruding portions overlap the gate electrode and the receded portions do not overlap the gate electrode, and a drain electrode spaced apart from the source electrode, wherein the source electrode and the drain electrode are symmetrical with respect to the gate electrode.

In another aspect, a driving element for an organic electroluminescent device including a gate electrode, an active layer over the gate electrode, a source electrode on the active layer, the source electrode includes an uneven shape having protruding portions and receded portions such that the protruding portions overlap the gate electrode and the receded portions do not overlap the gate electrode, and a drain electrode spaced apart from the source electrode, wherein the source electrode and the drain electrode are symmetrical with respect to the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
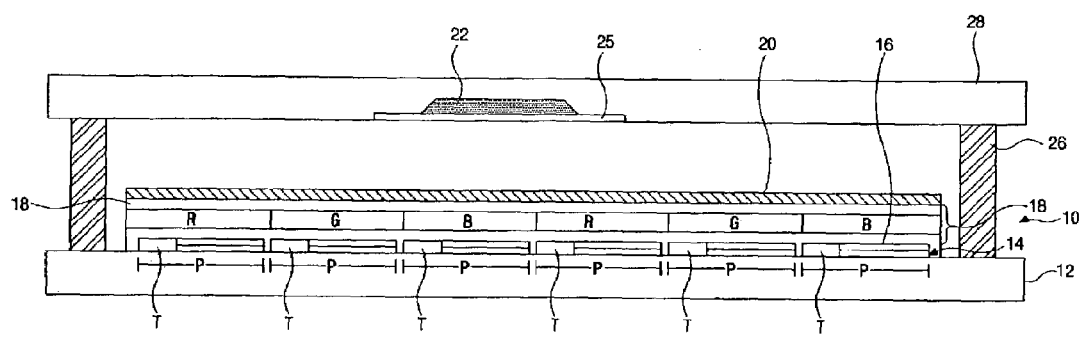
FIG. 1 is a schematic cross-sectional view of an organic electroluminescent device according to the related art.
Figure 2:
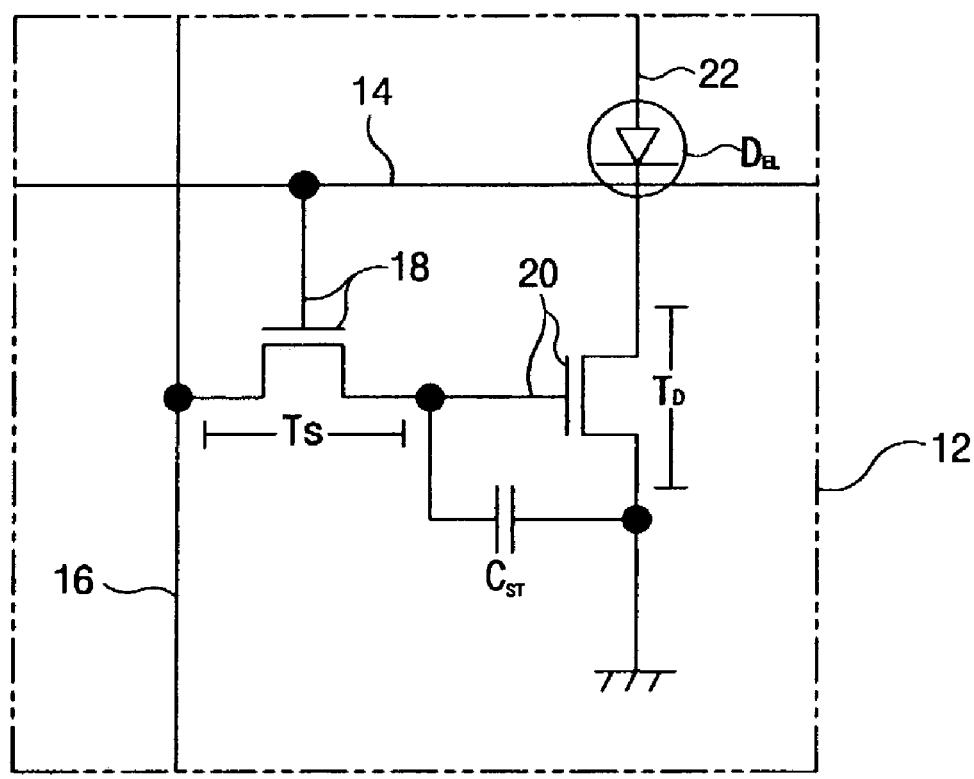
FIG. 2 is an equivalent circuit diagram of an organic electroluminescent device according to the related art.
Figure 3:
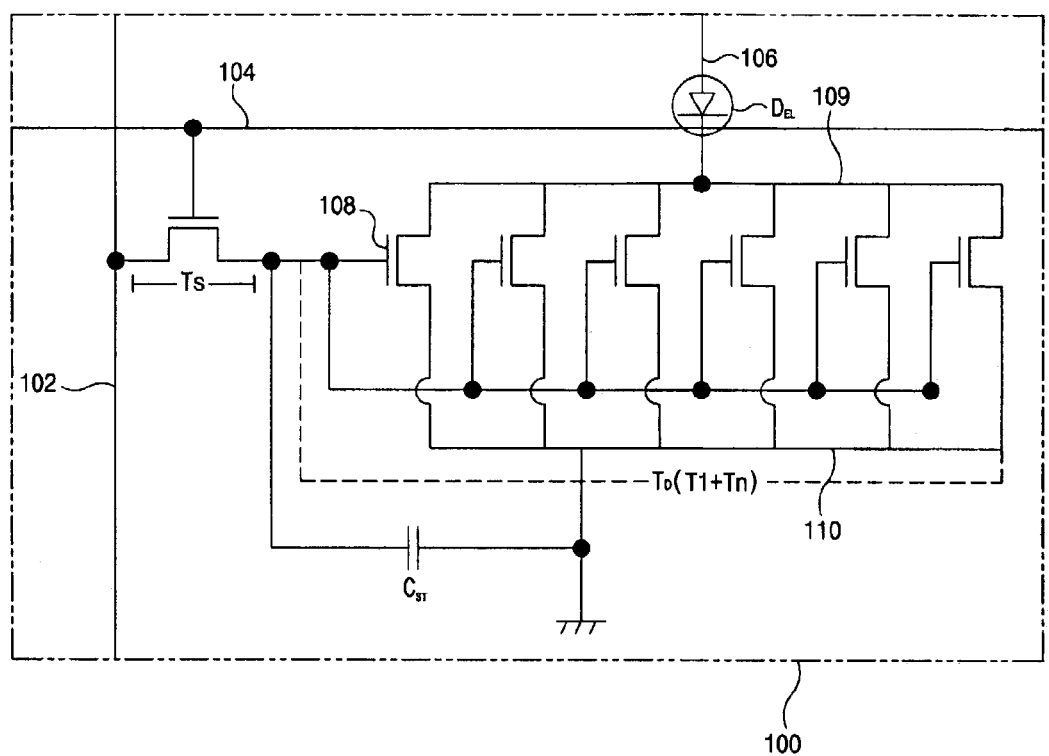
FIG. 3 is an equivalent circuit diagram of an exemplary organic electroluminescent device according to the present invention.

FIG. 3 is an equivalent circuit diagram of an exemplary organic electroluminescent device according to the present invention. In FIG. 3, a gate line 102 and a data line 104 may cross each other on a substrate 100, and a switching element "$T_S$" may be disposed at the crossing point of the gate line 102 and the data line 104. The switching element "$T_S$" may be electrically connected to a driving element "$T_D$." The driving element "$T_D$" may include a plurality of thin film transistors (TFTs) "$T_1$" to "$T_N$" connected to each other in parallel. A source electrode 109 of each of the plurality of TFTs "$T_1$" to "$T_N$" may be electrically connected to a first electrode of an organic electroluminescent diode "$D_{EL}$," and a second electrode of the organic electroluminescent diode "$D_{EL}$" may be electrically connected to a power line 106. A storage capacitor "$C_{ST}$" may be electrically connected to a driving gate electrode 108 and a driving drain electrode 110 of the plurality of TFTs "$T_1$" to "$T_N$."

Figure 4:
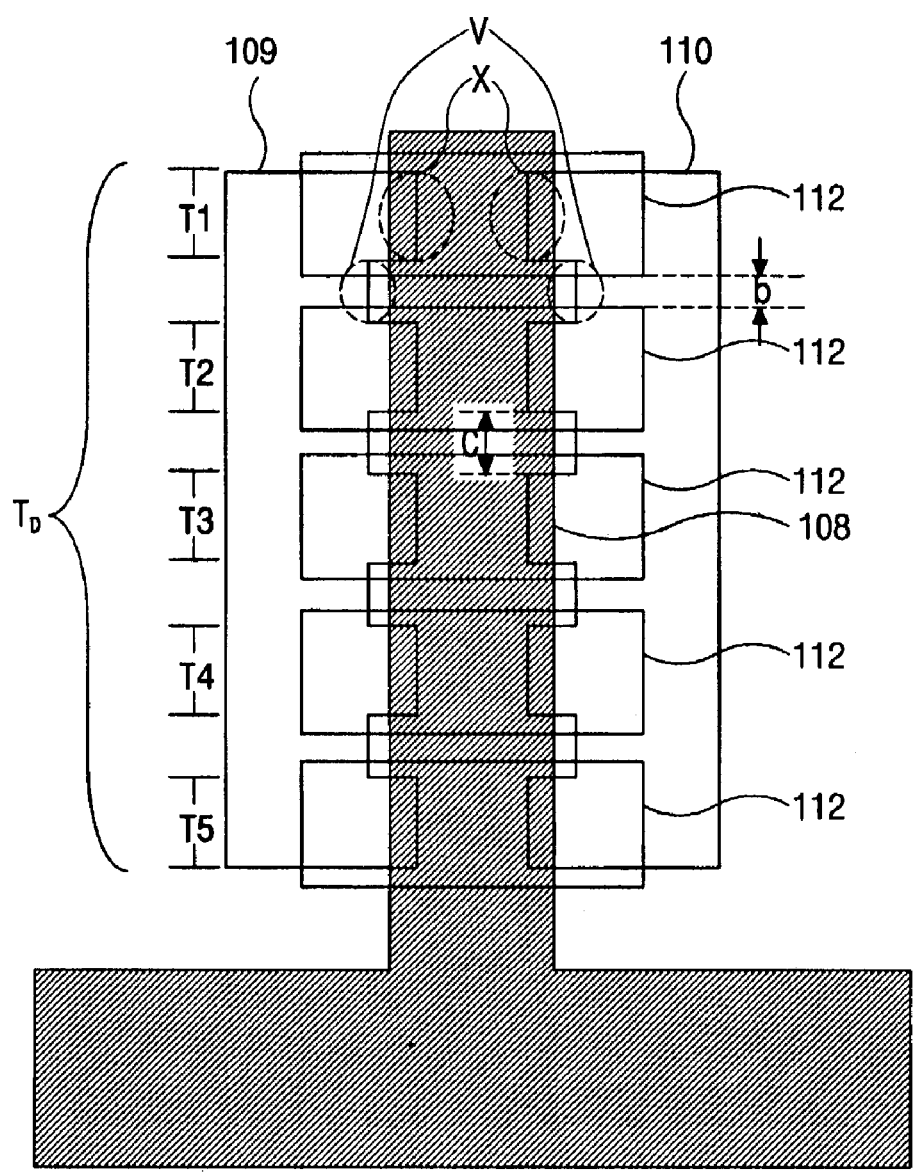
FIG. 4 is a schematic plan view of an exemplary driving element for an organic electroluminescent device according to the present invention.

FIG. 4 is a schematic plan view of an exemplary driving element for an organic electroluminescent device according to the present invention. In FIG. 4, a driving element "$T_D$" may include a plurality of TFTs. For example, the driving element "$T_D$" may include five TFTs, "$T_1$" to "$T_5$." A gate electrode 108 may be formed on a substrate, and a plurality of active layers 112 may be formed over the gate electrode 108. Each of the plurality of active layers 112 may be physically and electrically separated from adjacent active layers 112 by spaces "b." A total number of active layers may be determinative of a total number of TFTs. A source electrode 109 and a drain electrode 110 may be formed on each of the plurality of active layers 112. Each of the source electrodes 109 and each of the drain electrodes 110 may be physically separated from each other and may be symmetrical with respect to the gate electrode 108. In addition, each of the source electrodes 109 and each of the drain electrodes 110 may have an uneven shape including a protruding portion "X" and a receded portion "V." The protruding portion "X" corresponding to each active layer 112 may overlap the gate electrode 108. In contrast, the receded portion "V" corresponding to each space between adjacent active layers 112 may not overlap the gate electrode 108. Accordingly, the protruding portion "X" may function as the source electrode 109 and the drain electrode 110 for each TFT. As current density to the driving element "$T_D$" increases, the stress caused by the high current density may be distributed across the plurality of TFTs used to create the driving element "$T_D$." As a result, the characteristics of the driving element "$T_D$" may remain substantially consistent during operation.

Since the plurality of active layers 112 are spaced apart from each other, a gap "c" between the adjacent protruding portions "X" includes the space "b" between the adjacent active layers 112. Thus, as the total number of TFTs increases, the area occupied by the driving element "$T_D$" increases in proportion to the size of each space "b" between adjacent active layers 112. Moreover, since each of the source electrode 109 and the drain electrode 110 have steps between edges of the plurality of active layers 112, an etching solution may permeate into the receded portions "V" of the source electrode 109 and the drain electrode 110 due to capillary action. As the etching solution permeates into the receded portions "V," an open between the source electrode 109 and the drain electrode 110 may be created.

Figure 5:
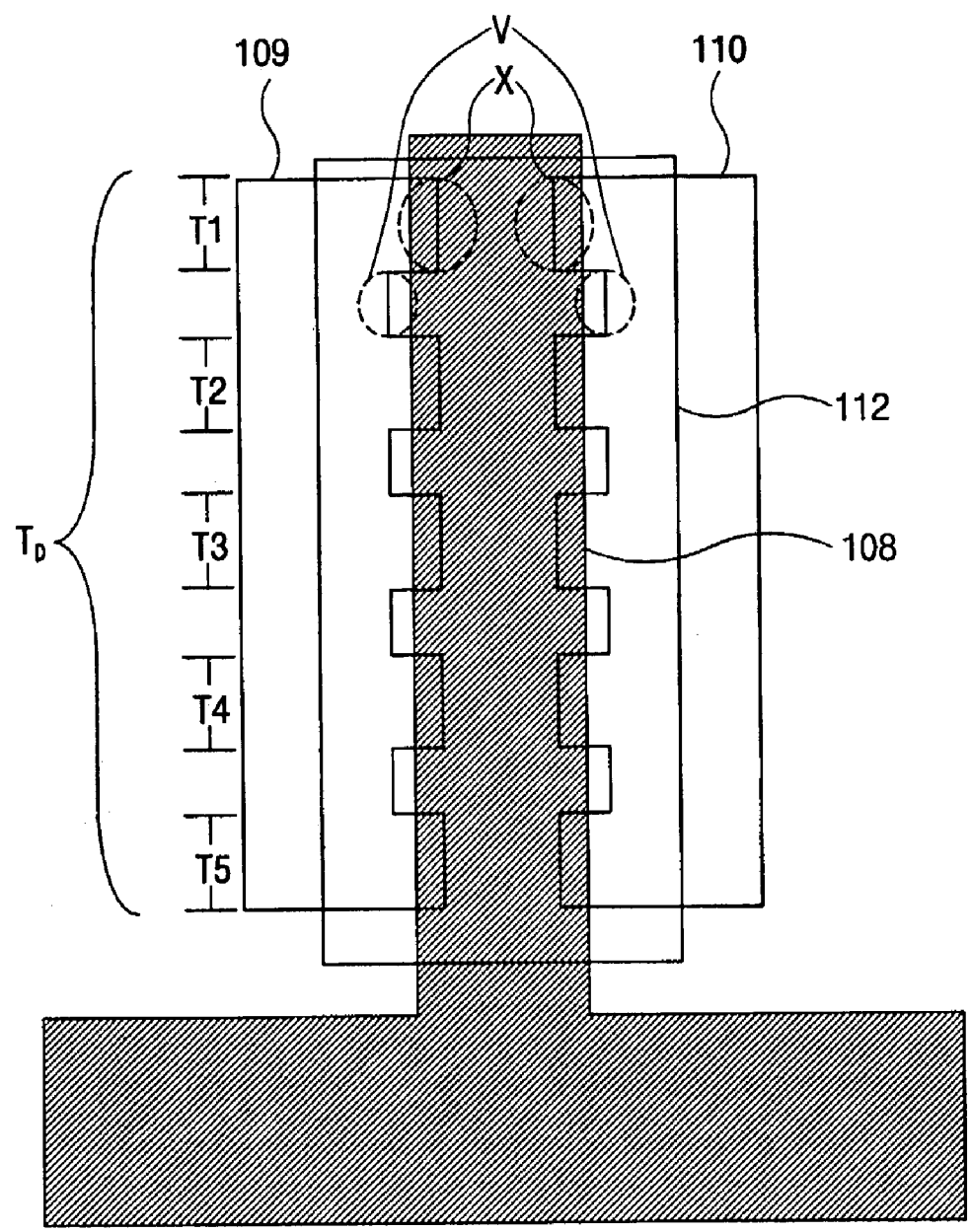
FIG. 5 is a schematic plan view of another exemplary driving element for an organic electroluminescent device according to the present invention.

FIG. 5 is a schematic plan view of another exemplary driving element for an organic electroluminescent device according to the present invention. In FIG. 5, an active layer 112 may be formed over a gate electrode 108, and a source electrode 109 and a drain electrode 110 may be formed on the active layer 112. The source electrode 109 and the drain electrode 110 may be physically separated from each other and may be symmetrical with respect to the gate electrode 108. The source electrode 109 and the drain electrode 110 may each have an uneven shape including a protruding portion "X" and a receded portion "V," wherein the protruding portion "X" may overlap the gate electrode 108, and the receded portion "V" may not overlap the gate electrode 108. A driving element "$T_D$" may include a plurality of TFTs. For example, the driving element "$T_D$" may include five TFTs, "$T_1$" to "$T_5$." The plurality of TFTs may be formed between the protruding portion "X" of the source electrode 109 and the drain electrode 110. Accordingly, since the active layer 112 is unified, the driving element "$T_D$" may require less area. Moreover, since the source electrode 109 and the drain electrode 110 have fewer steps, the potential for an open between the source electrode 109 and the drain electrode 110 may be reduced. Furthermore, as current density to the driving element "$T_D$" increases, the stress caused by the high current density may be distributed across the plurality of TFTs used to create the driving element "$T_D$." As a result, the characteristics of the driving element "$T_D$" may remain substantially consistent during operation.

The storage capacitor "$C_{ST}$" (in FIG. 3) may be electrically connected to the driving gate electrode 108 and the driving drain electrode 110. When the driving element "$T_D$" possesses the structure shown in FIG. 5, the protruding portion "X" of the drain electrode 110 may overlap the gate electrode 108. Since the overlapping portion of the gate electrode 108 and the protruding portion "X" functions as a storage capacitor, an extra storage capacitor may not be necessary.

Figure 6:
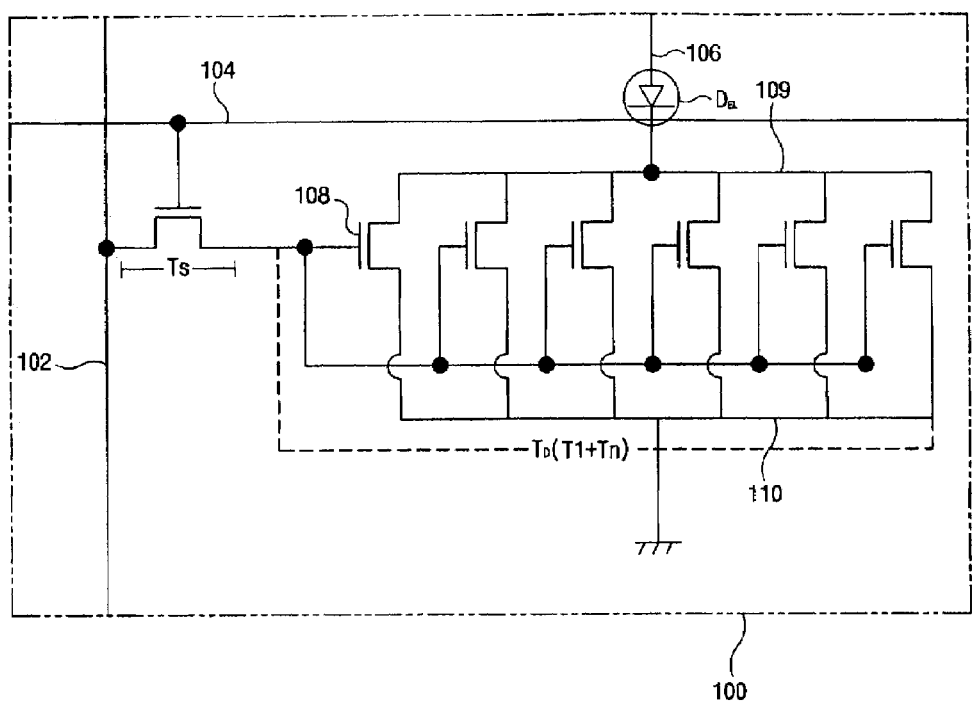
FIG. 6 is an equivalent circuit diagram of an exemplary organic electroluminescent device according to the present invention.

FIG. 6 is an equivalent circuit diagram of another exemplary organic electroluminescent device according to the present invention. In FIG. 6, a storage capacitor may not be included between a driving gate electrode 108 and a driving drain electrode 110 of a driving element "$T_D$," in contrast with the exemplary circuit diagram of FIG. 3.

The organic electroluminescent device using amorphous silicon thin film transistors as switching and driving elements includes a plurality of thin film transistors as the driving element. Since the plurality of thin film transistors are connected in parallel to each other, stress caused by high current density is distributed between the plurality of thin film transistors. Therefore, characteristics of the plurality of thin film transistors remain substantially consistent during operation. As a result, a high display quality may be obtained.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. A driving system for an organic electroluminescent device, comprising:

a gate electrode;

a plurality of active layers separated from each other by a spacing over the gate electrode;

a source electrode on each of the plurality of active layers, the source electrode including an uneven shape having a plurality of protruding portions and receded portions such that each of the protruding portions overlap the gate electrode along a length of the gate electrode and the receded portions do not overlap the gate electrode along the length of the gate electrode; and a drain electrode spaced apart from the source electrode, wherein the source electrode and the drain electrode are symmetrical with respect to the gate electrode, the source electrode is electrically interconnected to the organic electroluminescent device, and the plurality of protruding portions overlap each of the active layers with a gap between adjacent receded portions being greater than the spacing between each of the plurality of active layers.

2. The driving system according to claim 1, wherein the plurality of active layers include amorphous silicon.

3. The driving system according to claim 1, wherein the plurality of receded portions overlap spaces between adjacent active layers.

4. A driving element for an organic electroluminescent device, comprising:

a gate electrode;

an active layer over the gate electrode;

a source electrode on the active layer, the source electrode includes an uneven shape having a plurality of protruding portions and receded portions such that each of the protruding portions overlap the gate electrode along a length of the gate electrode and the receded portions do not overlap the gate electrode along a length of the gate electrode; and a drain electrode spaced apart from the source electrode, wherein the source electrode and the drain electrode are symmetrical with respect to the gate electrode, the source electrode is electrically interconnected to the organic electroluminescent device, and the plurality of protruding portions and receded portions overlap the active layer.

5. The driving element according to claim 4, wherein the active layer includes amorphous silicon.

* * * * *